(12) United States Patent
Noda et al.

(10) Patent No.: US 8,349,145 B2
(45) Date of Patent: Jan. 8, 2013

(54) METHOD OF BURYING METAL AND APPARATUS OF DEPOSITING METAL IN CONCAVE PORTION

(75) Inventors: Suguru Noda, Tokyo (JP); Satoshi Takashima, Asakura (JP)

(73) Assignee: Canon Anelva Corporation, Kawasaki-shi (JP)

( * ) Notice: Subject to any disclaimer, the term of this patent is extended or adjusted under 35 U.S.C. 154(b) by 277 days.

(21) Appl. No.: 12/856,177

(22) Filed: Aug. 13, 2010

(65) Prior Publication Data

US 2011/0031107 A1    Feb. 10, 2011

Related U.S. Application Data

(63) Continuation of application No. PCT/JP2009/052543, filed on Feb. 16, 2009.

(30) Foreign Application Priority Data

Feb. 15, 2008 (JP) ................................. 2008-034985

(51) Int. Cl.
*C23C 16/00* (2006.01)
*C23C 14/34* (2006.01)

(52) U.S. Cl. ............... 204/192.17; 204/192.15; 438/687; 438/694; 438/695; 438/696; 427/97.2; 427/97.7; 427/255.39

(58) Field of Classification Search ............. 204/192.15, 204/192.17; 427/580, 585, 96.1, 96.8, 97.1, 427/97.2, 97, 7, 255.39; 438/687, 694, 695, 438/696

See application file for complete search history.

(56) References Cited

U.S. PATENT DOCUMENTS

| | | | |
|---|---|---|---|
| 2002/0142572 A1 | 10/2002 | Sakamoto et al. | 438/586 |
| 2003/0145790 A1 | 8/2003 | Sakamoto et al. | 118/723 |
| 2004/0029384 A1 | 2/2004 | Sakamoto et al. | 438/689 |
| 2004/0091636 A1 | 5/2004 | Sakamoto et al. | 427/569 |
| 2005/0217579 A1 | 10/2005 | Sakamoto et al. | 118/715 |
| 2005/0230830 A1 | 10/2005 | Sakamoto et al. | 257/750 |
| 2006/0049136 A1 | 3/2006 | Samakoto et al. | 216/37 |
| 2006/0110535 A1 | 5/2006 | Matsuda et al. | 427/250 |
| 2006/0177583 A1 | 8/2006 | Sakamoto et al. | 427/250 |
| 2006/0191477 A1 | 8/2006 | Sakamoto et al. | 118/715 |
| 2006/0191481 A1 | 8/2006 | Sakamoto et al. | 118/723 |
| 2009/0324848 A1 | 12/2009 | Matsuda et al. | 427/564 |

FOREIGN PATENT DOCUMENTS

JP    2001-335933    12/2001

(Continued)

OTHER PUBLICATIONS

English Translation of an International Preliminary Report on Patentability issued in the International Application No. PCT/JP2009/0852543—7 pages.

(Continued)

*Primary Examiner* — Rodney McDonald
(74) *Attorney, Agent, or Firm* — Fitzpatrick, Cella, Harper & Scinto

(57) ABSTRACT

The present invention provides the technology for burying metal even in a fine concave portion such as trench and via. According to an embodiment of the present invention, a vapor of the metal as the objective material, a gas containing halogen for etching the metal, and a metal halide vapor made up of the metal element and the halogen element are supplied to the substrate, which thus forms a metal halide layer in the concave portion, and thereby deposits the metal under the metal halide layer. The procedure can achieve the above object.

13 Claims, 9 Drawing Sheets

FOREIGN PATENT DOCUMENTS

| | | |
|---|---|---|
| JP | 2003-147534 | 5/2003 |
| JP | 2003-226974 | 8/2003 |
| JP | 2003-264158 | 9/2003 |
| JP | 2005-026448 | 1/2005 |
| JP | 2005-206932 | 8/2005 |
| JP | 2005-320634 | 11/2005 |

OTHER PUBLICATIONS

International Search Report and Written Opinion issued in International Application PCT/JP2009/052543, mailed on Mar. 24, 2009 (12 pages).

International Preliminary Report of Patentability issued in International Application PCT/JP2009/052543, dated May 27, 2010 (10 pages).

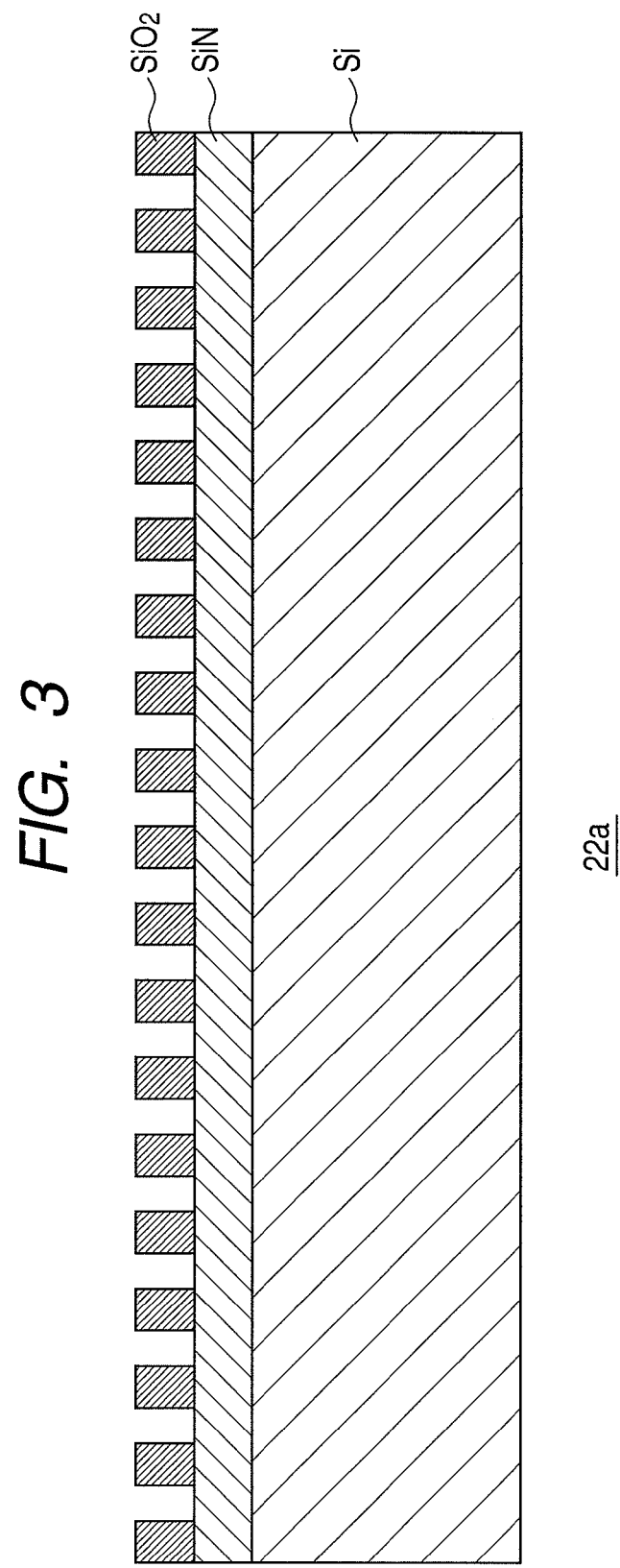

METHOD OF BURYING METAL AND APPARATUS OF DEPOSITING METAL IN CONCAVE PORTION

CROSS-REFERENCES TO RELATED APPLICATIONS

This application is a continuation application of International Application No. PCT/JP2009/052543, filed on Feb. 16, 2009, the entire contents of which are incorporated by reference herein.

This application also claims the benefit of priority from Japanese Patent Application No. 2008-034985 filed Feb. 15, 2008, the entire contents of which are incorporated herein by reference.

TECHNICAL FIELD

The present invention relates to a method of burying metal and an apparatus of depositing metal in a concave portion.

BACKGROUND ART

Design of semiconductor devices moves toward further high-speed and low-loss characteristics, which raises requirements of increased density and fineness of wiring in the circuit therein. The minimum wiring width currently required is several tens of nanometers. To satisfy such requirements, the aluminum alloy wiring has been substituted by copper wiring which has lower resistivity and more superior durability.

For example, there is a known technology of supplying metal atoms onto the surface of a substrate through the use of a physical method such as sputtering, thus forming a metal film on the substrate surface. Moreover, there is another known technology in which a liquid organic metal complex such as copper-hexafluoroacetylacetonato-trimethylvinylsilane is used as the raw material, which raw material is prepared in solid state, and then is dissolved in a solvent, followed by gasifying the raw material by utilizing a thermal reaction, thereby forming a copper film on a substrate.

Furthermore, there is a disclosed technology in which a gas made up of a halogen and a rare gas is supplied to a chamber to generate plasma of the gas and etch a target, thus forming a precursor being a compound of the metal existing in the target and the halogen, which precursor is then supplied onto the surface of a substrate to form a metal film thereon, (Patent Documents 1, 2, and the like).

Specifically in Patent Document 2, in conducting etching of a copper plate which is the material to be etched by using a $Cl_2$ gas plasma, the adequate control of the relation between temperatures of the copper plate and the substrate generates Cu in a hole created in the substrate, thus forming a thin film of Cu therein. As for the relation between temperatures of the copper plate and the substrate, the temperature of copper plate as the material to be etched is set to a high level (for example, 300° C. to 400° C.), and the temperature of the substrate is set to a low level (for example, about 200° C.).

That is, according to Patent Document 2, $Cl_2$ gas is supplied to the chamber and plasma is generated in the chamber, thus generating Cl radicals by the plasma dissociation reaction of the halogen gas. The generated Cl radicals cause the etching reaction with the copper plate which is the material to be etched to thereby generate CuCl vapor (containing also a polymer such as $Cu_3Cl_3$). When CuCl vapor and Cl radicals thus generated are supplied into the hole formed in the substrate, the reaction between the CuCl vapor and the Cl radicals forms Cu in the hole. By the deposition of the Cu, the Cu is buried in the hole.

In conducting the film-forming reaction of Cu in the hole, however, there occurs not only the film-forming reaction but also the etching reaction by the Cl radicals to the formed Cu film. Therefore, according to Patent Document 2, the amount of Cl radicals is controlled so that the Cu is buried in the hole, and an atmosphere is created in which the rate of the Cu film-forming reaction becomes slightly larger than that of the Cu etching reaction.

[Patent Document 1] Japanese Patent No. 3727878
[Patent Document 2] Japanese Patent No. 3653053

SUMMARY OF INVENTION

As the circuit becomes to have higher density and fineness, there is required a wiring technology of burying metal in a fine trench(s) or via(s). However, when the width of trench or the diameter of via becomes smaller, there arises a problem common to conventional sputtering technology and to conventional film-forming method using organic metal complexes of plugging the inlet of opening of the trench or the via at the time of forming metal film, which results in difficulty in burying the metal.

According to Patent Document 2, the $Cl_2$ gas is dissociated by plasma to generate Cl radicals in order to generate CuCl vapor by etching the copper plate, and in order to deposit Cu in the hole by the reaction with the generated CuCl vapor. As described above, Cu is deposited by the film-forming reaction between the CuCl vapor and the Cl radicals. When, however, the Cl radicals exist at a high density, the etching reaction of the above-mentioned deposited Cu by the Cl radicals becomes predominant compared with the film-forming reaction, which fails in conducting the Cu-burying in the hole. Consequently, according to Patent Document 2 in order to assure the predominance of the film-forming reaction, it is an essential requirement to control the amount of Cl radicals through the control of $Cl_2$ gas supply rate and of electric power density in generating plasma, and to thereby regulate the rate of the Cu film-forming reaction so as to become slightly larger than the rate of the Cu etching reaction.

Accordingly, in Patent Document 2, since there occur the Cu-film formation and the etching of the formed Cu film in burying Cu in the hole, it takes a time to complete the burying. Furthermore, since a part of once formed film of Cu is etched, the ratio of the film-formed Cu buried in the hole relative to the consumed amount of copper etched by the Cl radicals decreases, which results in increasing the production cost.

As described above, the requirements of allowing burying of the metal in a concave portion such as the trench and the via as well as shortening the production time, and reducing the cost of manufacturing apparatus also need to be satisfied.

The present invention has been derived to cope with the above problems, and an object of the present invention is to provide a method of burying metal and an apparatus of depositing metal in a concave portion, by which metal can be formed in the concave portion while shortening the burying time and reducing the production cost, even in the case of small width of a trench and small diameter of a via.

The first aspect of the present invention is a method of burying metal, comprising the steps of: preparing a substrate having a concave portion formed thereon; and supplying a metal vapor made up of a metal in a gaseous state, a halogen-containing gas containing at least a halogen for etching the metal, and a metal halide vapor made up of a metal halide in a gaseous state which is a compound of element of the metal and element of the halogen, to the substrate, thus depositing the metal halide in the concave portion to form a metal halide layer therein, and thereby depositing the metal under the metal halide layer.

The second aspect of the present invention is an apparatus of depositing metal in a concave portion formed on a substrate, comprising: a chamber; a supporting member placed in the chamber and capable of supporting the substrate; and a gas-supplying means to supply a specific gas to the chamber, wherein the apparatus is controlled so that the supplied specific gas allows, in the chamber, the presence of a metal vapor made up of the metal in a gaseous state, a halogen-containing gas containing at least a halogen for etching the metal, and a metal halide vapor made up of a metal halide in a gaseous state which is a compound of element of the metal and element of the halogen, thus depositing the metal halide in the concave portion to form a metal halide layer therein, and thereby depositing the metal under the metal halide layer.

The third aspect of the present invention is an apparatus of depositing metal in a concave portion, comprising a vacuum chamber containing: a target table placing a metal target thereon; a substrate table positioned so as to face the target table and capable of placing a substrate, having a concave portion formed on the surface thereof, thereon; a first gas supply opening to supply a rare gas; and a second gas supply opening to supply a halogen-containing gas containing at least a halogen for etching the metal constituting the metal target, wherein the target table has a plasma electrode, the first gas supply opening is positioned at a closer side to the target table relative to the second gas supply opening, and the apparatus is controlled so that the rare gas supplied from the first gas supply opening and the halogen-containing gas supplied from the second gas supply opening allow, in the vacuum chamber, the presence of a metal vapor made up of the metal in a gaseous state, the halogen-containing gas, and a metal halide vapor made up of a metal halide in a gaseous state which is a compound of element of the metal and element of the halogen, thus depositing the metal halide in the concave portion to form a metal halide layer, and thereby depositing the metal under the metal halide layer.

According to the present invention, in burying metal in a concave portion, a metal halide layer is formed in the concave portion. Since the metal halide layer is formed in the concave portion by capillary condensation, even if the concave portion is in a fine trench or via, the concave portion can be buried with metal. Furthermore, since the metal halide layer formed during the above-mentioned burying step functions as a protective layer against the halogen gas etching, the etching of the metal being formed under the metal halide layer by the halogen gas can be suppressed, which allows efficient burying of metal. As a result, the production speed can be increased and the production cost can be decreased.

BRIEF DESCRIPTION OF THE DRAWINGS

FIG. 3 shows a cross sectional view of substrate in an embodiment of the present invention.

BEST MODES FOR CARRYING OUT THE INVENTION

Figure 1:
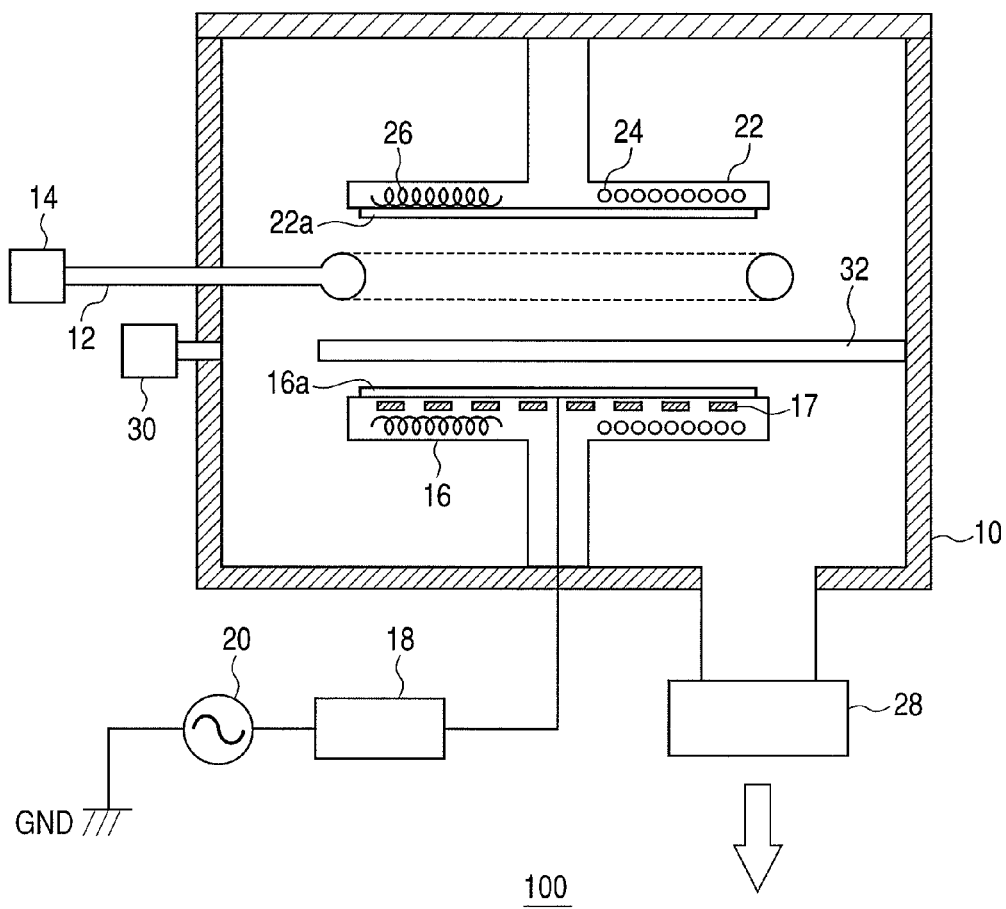
FIG. 1 shows a cross sectional view indicating the structure of a wiring-forming apparatus in an embodiment of the present invention.

The embodiments of the present invention will be described in detail below referring to the drawings. In the following-given drawings, the articles having the same function are represented by the same reference numeral, without duplicated description.

[Structure of Apparatus]

A wiring-forming apparatus 100 in an embodiment of the present invention has, as illustrated in FIG. 1, a chamber 10, a gas supply nozzle 12, a gas flow controller 14, a plasma electrode 16, a magnet 17, a matching box 18, a power source 20, a substrate table 22, a cooling means 24, a heating means 26, a vacuum pump 28, a vacuum gauge 30, and a shutter 32.

The chamber 10 is fabricated in a cylindrical shape by a metal (such as aluminum, stainless steel, or titanium). An exhaust opening is located at lower part of the chamber 10. The exhaust opening of the chamber 10 is connected to the vacuum pump 28. The vacuum pump 28 evacuates the chamber 10 through the exhaust opening. The internal pressure of the chamber 10 is measured by the vacuum gauge 30. Furthermore, in addition to the vacuum pump 28, an auto-pressure controller (APC) may be installed. The internal pressure of the chamber 10 can be maintained to a certain level by actuating the vacuum pump 28 and by adjusting the conductance at the exhaust opening part through the use of the APC in response to the signal generated from the vacuum gauge 30.

The plasma electrode 16 is positioned at a bottom plate side of the chamber 10. The plasma electrode 16 has a structure of supporting a target 16a made of metal (such as copper or titanium) as the film-forming material in the chamber 10.

The plasma electrode 16 is connected to the matching box 18 and the power source 20. The power source 20 is connected so as to transmit electric power to the target 16a, which is supported by the plasma electrode 16, then to the chamber 10 through the matching box 18. The power source 20 generates, for example, electric power in RF band. That is, the plasma electrode 16 (target 16a), the matching box 18, and the power source 20 form a means for generating plasma for film-forming. The plasma electrode 16 is provided with the magnet 17. The wiring-forming apparatus 100 in the embodiment functions as the magnetron-sputtering apparatus. The magnet 17 may be a normal magnet, or may be an electric magnet.

The plasma electrode 16 may have a cooling means. Alternatively, for example, there can be adopted a structure in which the target 16a is transferred from a separate load-lock chamber (not shown) and is placed on the plasma electrode 16 through a gate valve (not shown), or the like.

The substrate table 22 is positioned at an upper part of the chamber 10 so that the substrate-mounting surface faces the plasma electrode 16 (target 16a) which is located at a bottom plate side of the chamber 10. Generally the substrate table 22 is in a cylindrical shape. On the substrate-mounting surface of the substrate table 22, there is positioned a substrate 22a (for example, semiconductor substrate of silicon substrate and the like, and insulated substrate such as glass) which is the material for forming the metal film thereon. Alternatively, for example, there can be adopted a structure in which the substrate 22a is transferred from a separate load-lock chamber (not shown) and is placed on the substrate table 22 through a gate valve (not shown), or the like.

The substrate table 22 has the cooling means 24. A coolant supplied from outside is circulated in the substrate 22 by the cooling means 24 under the control of a control part (not shown), and thus the cooling means 24 is used to adjust the temperature of the substrate table 22. Furthermore, the substrate table 22 has the heating means 26. The heating means 26 can be a resistive heater, or the like. The heating means 26 is used to adjust the temperature of the substrate table 22 under the control of the control part.

The gas supply nozzle 12 is located on a side wall of the cylindrical chamber 10. The gas supply nozzle 12 is preferably fabricated by, for example, forming a hollow pipe into a cylindrical shape and then by opening the gas-discharge hole on the periphery of the pipe. Furthermore, the gas-discharge hole is preferably positioned so that the gas is emitted toward the substrate 22a which is supported on the substrate table 22. The gas-discharge nozzle 12 is, however, not limited to that type.

A gas supply apparatus (not shown) is connected to the gas supply nozzle 12 by way of the gas flow controller 14. The gas supply nozzle 12 is installed to supply the halogen-containing gas into the chamber 10. The gas flow controller 14 controls the gas being supplied to the chamber 10 so as to maintain a specified flow rate at the time of forming metal film.

The shutter 32 is used to stop the supply of raw material and the like from the target 16a to the substrate 22a during the early stage of film-forming until the internal condition of the chamber 10 stabilizes. The structure of the shutter 32 may be configured such that the surface of the substrate 22a supported by the substrate table 22 or the surface of the target 16a supported by the plasma electrode 16 can be covered.

Figure 9:
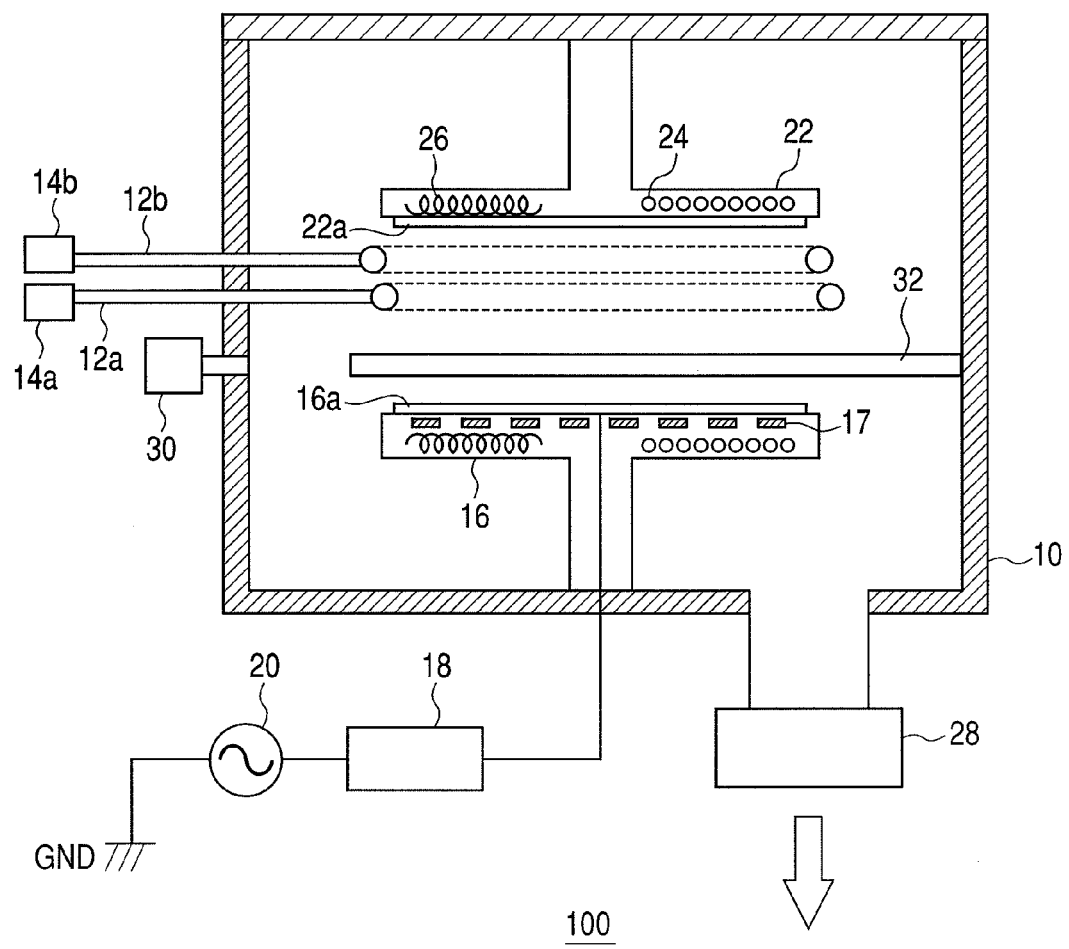
FIG. 9 shows a cross sectional view indicating another structure of a wiring-forming apparatus in an embodiment of the present invention.

FIG. 9 shows a modified example of an embodiment of the wiring-forming apparatus of the present invention. In this example, two of the gas supply nozzles are positioned at the respective substrate side and target side. In FIG. 9, instead of the gas supply nozzle 12 in the wiring-forming apparatus of FIG. 1, there are provided a gas supply nozzle 12a for supplying the rare gas such as argon (Ar) or krypton (Kr), and a gas supply nozzle 12b for supplying the halogen gas. The gas supply nozzles 12a and 12b are connected to gas flow controllers 14a and 14b, respectively.

[Film-Forming Processing]

The method of forming wiring of the present invention will be described below referring to FIG. 1.

Before forming the metal film on the substrate 22a, the substrate 22a is placed on the substrate table 22, and the target 16a is attached to the plasma electrode 16. As described before, the substrate 22a which is the material to form the metal film thereon can be set as a semiconductor substrate such as silicon substrate, an insulation substrate such as glass substrate, or a metal substrate such as aluminum substrate. The substrate 22a has at least one concave portion formed thereon.

In addition, in the present specification, the term "concave portion" signifies a depressed part such as a trench or a via, formed on the substrate. The concave portion may be formed by the patterning into a specified shape.

The target 16a can be set as, for example, a metal to form a film thereof on the substrate 22a, such as copper, aluminum, titanium, or the like. When a film of an alloy is formed on the substrate 22a, the target 16a containing pluralities of metal elements for film-forming may be installed.

Next step is evacuating the chamber 10 to a necessary vacuum level by using the vacuum pump 28. At the time of forming the film, the gas is supplied to the chamber 10 through the gas supply nozzle 12. In this step, by adopting feedback control of the opening degree of the flow control valve by using the APC mounted on the vacuum pump 28 based on the pressure detected by the vacuum gauge 30, the internal gas pressure of the chamber 10 can be set as a predetermined value.

The gas supplied from the gas supply nozzle 12 is set as a gas in which halogen such as chlorine ($Cl_2$) is diluted by using a rare gas such as argon (Ar) or krypton (Kr). More specifically, the gas is preferably set as the gas in which halogen is diluted by using a rare gas so as to reach a concentration of halogen within the range of 0.1 to 50% by volume.

Furthermore, as shown in the wiring-forming apparatus of FIG. 9, the rare gas and the halogen may be separately supplied to the chamber 10, and may be adjusted such that the concentration of halogen in the chamber 10 is within the range of 0.1 to 50% by volume. The gas supply pressure is preferably set within the range of 0.1 to 100 Pa. Within the range of the pressure, the rare gas sufficiently becomes plasma.

The rare gas is supplied from the target-side gas supply opening 14a, while the halogen gas is supplied from the substrate-side gas supply opening 14b. That supply mode is preferred because the halogen gas is not easily excited.

The temperature of the substrate 22a is controlled by the control part which controls the cooling means 24 and the heating means 26 in the substrate table 22. Specifically it is preferable that the temperature of the substrate 22a is set within the range of 400° C. or below.

Under the gas-supplying condition, a specified electric power of direct current or high frequency (alternate) current is supplied from the power source 20 to the plasma electrode 16 through the matching box 18, to supply the electric power to the chamber 10. Specifically it is preferable to supply electric power at a power density ranging from $1 \text{ kW/m}^2$ to $1 \text{ MW/m}^2$. At this moment, it is especially effective to mount a magnet on the plasma electrode 16 to conduct the magnetron sputtering.

The step excites the rare gas in the gas to generate the gas plasma. By adjusting the power of electromagnetic waves supplied from the power source 20, the gas flow rate, the pressure, and the like, the gas plasma can be generated in the vicinity of the target 16a at the time of the film-forming stage.

For example, when the gas of chlorine ($Cl_2$) diluted by argon (Ar) is supplied, the argon (Ar) is excited to generate plasma.

The plasma sputters the target 16a to form a vapor including gaseous state metal, (hereinafter referred also to as "metal vapor"). The halogen gas made up of halogen can be directly supplied, or can be formed by dissociation of the supplied halogen-containing gas (such as hydrogen chloride (HCl)) by the plasma. Furthermore, the metal vapor reacts with the halogen gas to form a metal halide vapor including a compound of the element of the above metal and the element of the above halogen. The metal halide vapor is formed by the reaction between the metal constituting the target 16a and the halogen gas, or formed by the reaction between the metal formed outside the concave portion such as a via (hole) formed on the substrate and the halogen gas. In addition, the metal halide vapor dissociates in the plasma to thereby also cause a reaction of re-production of the metal vapor and the halogen gas. These three of metal vapor, halogen gas, and metal halide vapor are supplied to the substrate 22a.

That is, according to the present invention, the gas for sputtering the target 16a, (rare gas such as argon (Ar) or krypton (Kr), hereinafter referred also to as "sputtering gas"), supplied to the chamber 10 together with the halogen gas is subjected to plasma-excitation, and the sputtering gas plasma generates a metal vapor from the target 16a, or metal atoms are expelled from the target 16a. A part of the generated metal vapor reacts with the halogen gas, as described above, to generate the metal halide vapor, while other part thereof is supplied to the substrate 22a. The metal halide vapor may also be generated by a reaction between the supplied halogen gas and the target 16a. A part of thus generated metal halide vapor is supplied to the substrate 22a, while other part thereof dissociates in the plasma to generate the metal vapor and the halogen gas. A part of thus generated metal vapor is supplied to the substrate 22a, while other part thereof reacts with the halogen gas to generate the metal halide vapor.

Various reactions occur as described above, and there are supplied the metal vapor, the halogen gas, and the metal halide vapor to the substrate 22a. That is, in the present invention, it is important to ensure adequate presence of the metal vapor, the halogen gas, and the metal halide vapor during the formation of the metal layer in the concave portion, and the film-forming processing is performed under the condition of adequate presence of them.

Figure 2A:
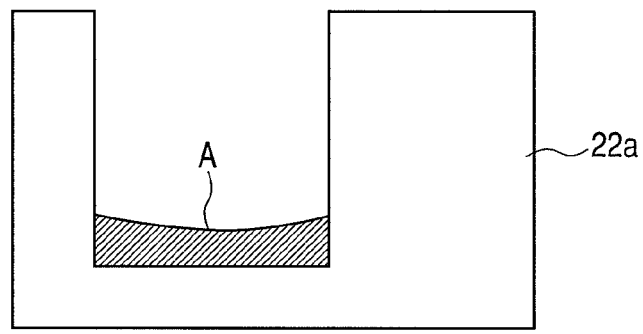
FIG. 2A shows a drawing for explaining a film-forming reaction expected in an embodiment of the present invention.

Under such condition, it is presumed that condensation or precipitation reaction of the metal halide occurs on the surface of the substrate 22a having a concave portion such as a trench and a via thereon. By the capillary condensation, the metal halide condenses or precipitates selectively on the bottom of the trench or the via. During the early stage of reaction, when the heating means 26 controls the substrate temperature to adequately control the saturated vapor pressure of the metal halide vapor within the concave portion, supplied to the concave portion, the metal halide begins to deposit from the supplied metal halide vapor in the trench or the via, and thus the metal halide layer A having a negative curvature on the bottom of the trench or the via is formed (FIG. 2A).

Figure 2B:
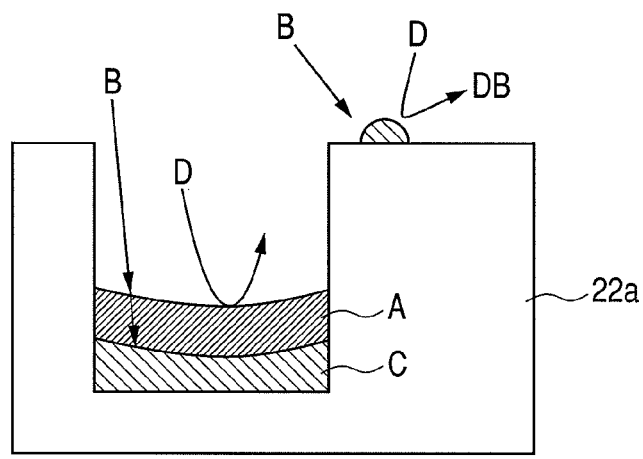
FIG. 2B shows a drawing for explaining a film-forming reaction expected in an embodiment of the present invention.

When the supplied metal vapor, or the metal atoms B, come to adhere to the metal halide layer A, the metal atoms B are incorporated into the metal halide layer A by the difference of surface energy, and thus the metal layer C is precipitated and deposited on the bottom of the trench or the via. At that moment, the halogen D which is the supplied halogen gas is blocked by the metal halide layer A on the surface of the precipitated metal layer C. As a result, the metal layer C formed in the trench or the via is not etched by the halogen D, and only the metal layer formed outside the trench or the via is etched by the halogen D (FIG. 2B).

Figure 2C:
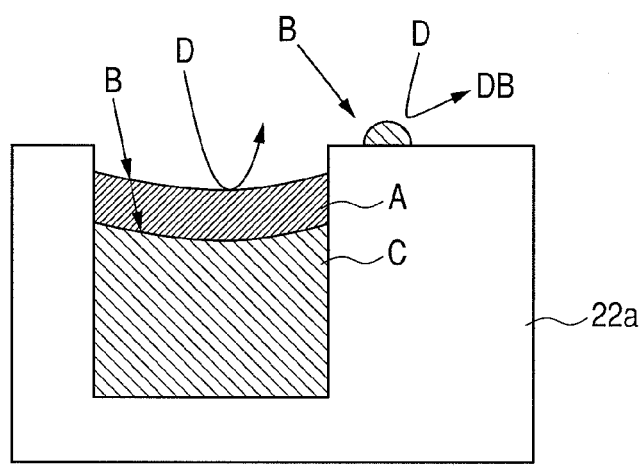
FIG. 2C shows a drawing for explaining a film-forming reaction expected in an embodiment of the present invention.

The uppermost surface of the metal halide layer A stays with a negative curvature at an edge of entrance of the trench or the via, and continues to block the etching of the metal layer C. As a result, the metal layer C is buried and formed only in the trench or the via (FIG. 2C).

For example, when the target 16a is set as copper (Cu), and the halogen supplied to the chamber 10 is set as argon (Ar) containing chlorine ($Cl_2$), the metal halide layer A becomes CuCl, the metal B becomes Cu, the metal layer C becomes Cu, the halogen D becomes $Cl_2$ or Cl, the product BD generated by the etching becomes CuCl. Furthermore, the metal vapor becomes Cu atoms, and the metal halide vapor becomes CuCl.

As described above, in the present invention, the formation of the metal halide layer A in the concave portion is important. According to the present invention, the supply rate of Cu vapor is controlled by the sputtering output (electric power supplied to the target electrode 16), and the supply rate of $Cl_2$ gas is controlled by the concentration of $Cl_2$ in the gas supplied from the gas supply nozzle 12. Among the supplied Cu vapor and the $Cl_2$ gas, a certain portion of them reacts to form the CuCl vapor. Since, however, the CuCl has Cu/Cl ratio of 1, the partial pressure of the CuCl can be controlled by the above-mentioned sputtering output and the $Cl_2$ concentration. Furthermore, there can easily be executed the control of balance between Cu vapor and $Cl_2$ gas remaining which has not contributed to the formation of CuCl.

Figure 6:
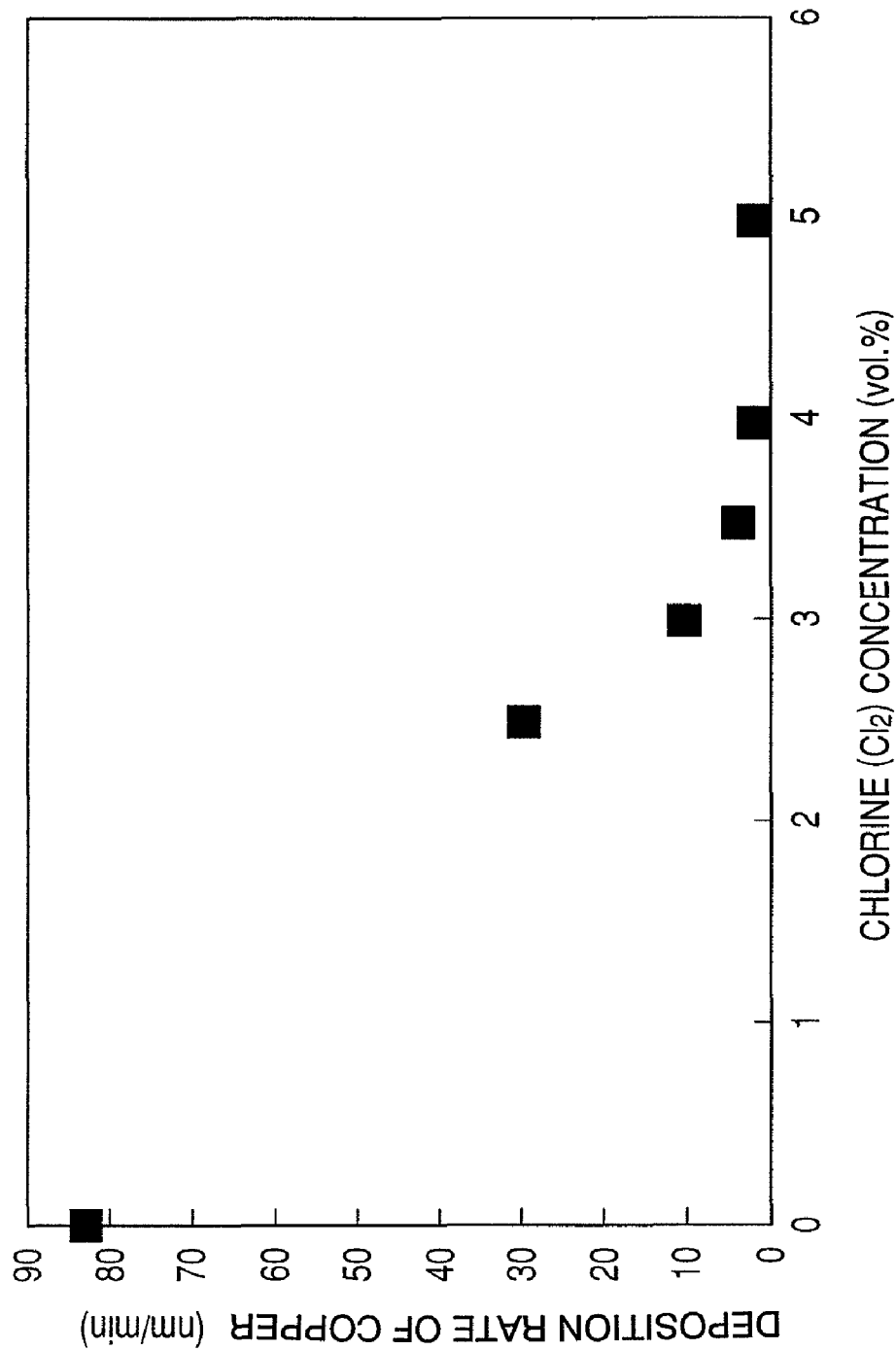
FIG. 6 shows a graph indicating the dependency of copper film-forming rate on the chlorine concentration in an embodiment of the present invention.

Although detail description will be given later referring to FIG. 6, when, for example, the electric power applied to the plasma electrode 16 is set as 100 W and when the $Cl_2$ concentration is set as about 4% by volume, the Cu can deposit very little on a smooth surface of substrate, and the Cu vapor and the $Cl_2$ gas maintain balance.

On the other hand, when the temperature of substrate 22a is controlled, and when the saturated vapor pressure of the CuCl vapor in the trench or the via becomes lower than the partial pressure of the CuCl vapor, the CuCl vapor supplied to the trench or the via begins to condense, and the deposition of CuCl begins. The partial pressure of the CuCl vapor depends on the sputtering output and the $Cl_2$ concentration.

According to the present invention therefore, the electric power supplied to the plasma electrode 16 and the supply rate of the $Cl_2$ gas from the gas supply nozzle 12 are adequately set to control the sputtering output and the $Cl_2$ concentration, thereby controlling the partial pressure of the CuCl vapor, and depending on the partial pressure of the CuCl vapor, the substrate temperature is controlled by the heating means 26 or by the cooling means 24 so that the saturated vapor pressure of CuCl in the concave portion becomes lower than the partial pressure of the CuCl vapor. For example, by controlling the substrate temperature and the partial pressure of CuCl vapor, there can be created a state where the saturated vapor pressure of CuCl in the concave portion becomes lower than the partial pressure of CuCl vapor, which thus allows forming the metal halide layer A that functions as the protective layer against the halogen D etching.

In this state, for example, by setting the above-mentioned conditions to maintain balance between the Cu vapor and the $Cl_2$ gas, the Cu formed on the substrate 22a on a flat face other than the trench or the via can be adequately etched.

That is, the apparatus of wiring-forming according to the present invention allows control of the conditions such as the substrate temperature, the sputtering output, and the supply rate of $Cl_2$ gas so that the CuCl layer is formed in the concave portion formed on the substrate 22a by the Cu vapor, the $Cl_2$ gas, and the CuCl vapor in the chamber 10, and the Cu layer deposits under the CuCl layer.

As described above, by depositing metal on the substrate 22a, and also by supplying halogen gas as the etchant for etching the metal deposit, and metal halide vapor which presumably functions as a protective film for protecting the metal deposit from the etching, it is considered that the burying of metal in the trench or the via formed on the surface of the substrate 22a can be performed.

Since the capillary condensation more likely occurs in smaller width of the trench or in smaller diameter of the via, the metal burying and forming in the trench having a smaller width and the via having a smaller diameter, which is incapable of conventional metal burying technology, becomes possible. In concrete terms, the metal burying and forming in a concave portion having a pore size of 0.2 μm or less which has been difficult for burying metal until now, becomes possible. Furthermore, for the above smaller pore of trench or via, the metal burying and forming can be attained independent of the aspect ratio thereof.

Here, according to Patent Document 2, plasma excitation of the supplied $Cl_2$ gas generates Cl radicals, which Cl radicals are subjected to etching reaction with the copper plate positioned facing the substrate for forming film thereon to generate CuCl vapor, and the CuCl vapor and the Cl radicals are supplied onto the substrate. In a hole formed on the substrate, the supplied Cl radicals extract the Cl from the supplied CuCl vapor, which forms the Cu layer. Consequently, in the same space in the hole, the reduction and the etching by the Cl radicals occur at the same time. As a result, the decrease in the film-forming rate and the deterioration in the Cu film-forming efficiency occur by the effect of etching against the formed Cu layer.

On the other hand, according to the present invention, in order to generate the metal vapor contributing to the formation of metal layer and the metal halide vapor for forming the metal halide layer, which functions as the protective layer against the halogen gas etching, in the concave portion, the sputtering gas for sputtering the target added to the halogen gas is supplied to the chamber, which forms an atmosphere with a balance among the metal vapor, the halogen gas, and the metal halide vapor.

Consequently, it is possible to supply the metal vapor by an amount satisfactorily contributing to the formation of layer and to supply the metal halide vapor for forming the protective layer into the concave portion, which thus allows forming the metal layer C in the concave portion while forming the metal halide layer A therein. Since the metal halide layer A blocks the etching to the metal layer C by halogen D, the formation of metal layer C can be carried out while suppressing the etching by the halogen D. As described above, the present invention is fundamentally different from the technology of Patent Document 2 which is based on the premise that etching of the metal layer is conducted in forming the metal layer in the concave portion, and is able to suppress the etching given in Patent Document 2, thus allowing efficiently burying the metal in the concave portion. Accordingly, production speed can be increased and production cost can be reduced.

During the early stage of film-forming step, the condition inside the chamber 10 such as the plasma condition, is unstable, it is preferable to shut off the substrate 22a from the target 16a by using the shutter 32 until the condition in the chamber 10 stabilizes. The stabilization period is preferably set within the range of about 10 seconds to about 20 minutes.

EXAMPLES

Example 1

Example 1 will be described below. Example 1 used the wiring-forming apparatus given in FIG. 1. In this Example, the applied substrate 22a was a silicon substrate which was prepared by forming sequentially a silicon nitride film and a silicon oxide film on the surface of the substrate, and by forming vias having a diameter of 0.16 μm as the silicon oxide film, as illustrated in FIG. 3. The aspect ratio of the via was 2.3 as a via-top basis and was 3.0 as a via-bottom basis. The supplied gas was a chlorine ($Cl_2$) gas diluted by argon (Ar). The concentration of the $Cl_2$ gas was set as 3.4% by volume, and the total pressure was adjusted to 1.3 Pa. Furthermore, the target 16a was a copper plate. That is, the pressure of the gas ambient at the time forming metal vapor and wiring, (the total pressure at the time of forming the metal vapor and wiring (the pressure at the time depositing metal in the concave portion), or the total pressure in the chamber 10), was 1.3 Pa.

Before conducting the film-formation, the heating means 26 heated the substrate 22a to maintain the temperature thereof within the range of 190° C. to 200° C. After that, only argon (Ar) was supplied to the chamber 10 to clean the surface of the target 16a. The cleaning time was 10 minutes.

Then, the gas diluted to 3.4% by volume of $Cl_2$ gas by argon (Ar) was supplied to the chamber 10, and 100 W of electric power was applied from the power source 20 to the plasma electrode 16 to generate plasma in the chamber 10. The electric power density applied to the target was 12.3 $kW/m^2$. At this moment, the shutter 32 was kept closed to prevent from the occurrence of reaction on the surface of the substrate 22a. This condition was held for 10 minutes to stabilize the reaction system.

Then, the shutter 32 was opened, and the $Cl_2$ gas, the Cu vapor, and the CuCl vapor were supplied onto the substrate 22a to form the CuCl layer as the protective layer in the vias, and thus the metal (Cu layer) was deposited under the formed CuCl layer. The reaction time was varied within the range of 0.5 to 30 minutes. The temperature of the substrate 22a at the beginning of the film-formation was maintained within the range of 190° C. to 200° C. by using the heating means 26 and the cooling means 24.

After forming the film, electric power supply from the power source 20 was stopped, and the gas supply was stopped to extinguish the plasma. By stopping the heating by the heating means 26, the temperature of the substrate 22a was returned to room temperature. Then, the substrate 22a was taken out from the chamber 10.

The thickness and the composition of the metal film formed on the surface of the substrate 22a were determined by an energy-dispersive X-ray fluorescence spectroscope (XRF). The condition of metal burying in the vias was determined by surface observation and cross-section observation by using a scanning electron microscope (SEM). The surface observation result is given in FIG. 4, and the cross-section observation result is given in FIG. 5.

Figure 4:
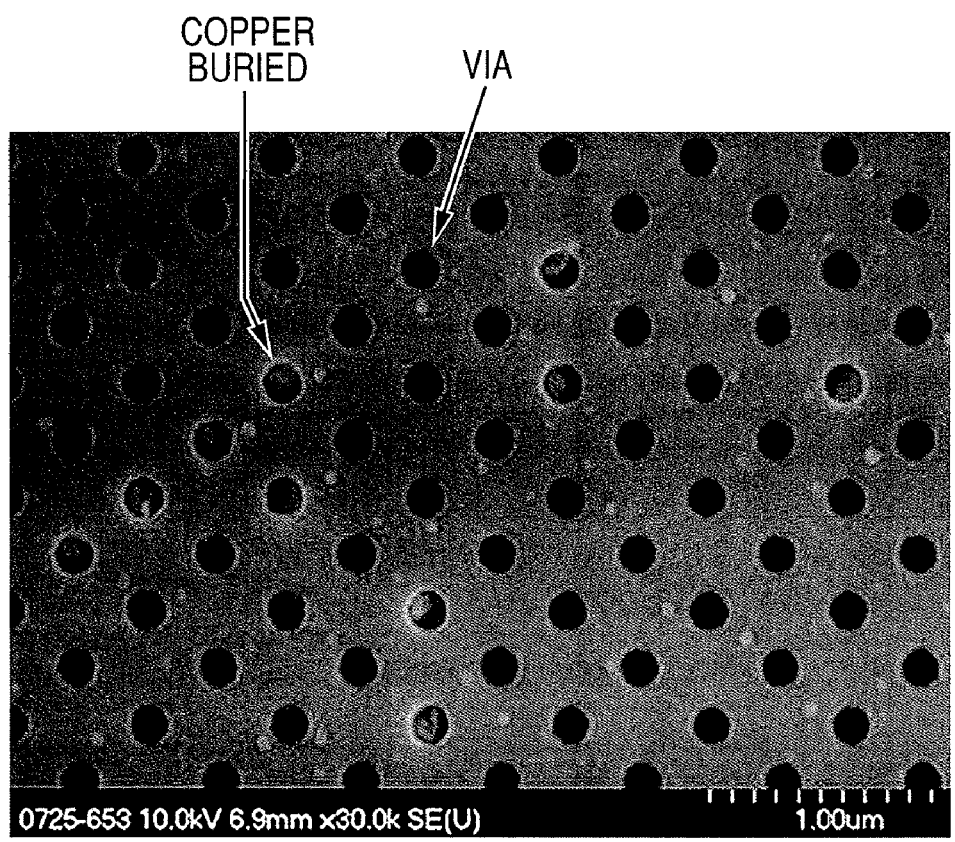
FIG. 4 shows an electron microscope photograph indicating a surface observation of a substrate on which vias are buried with metal, in an example of the present invention.
Figure 5:
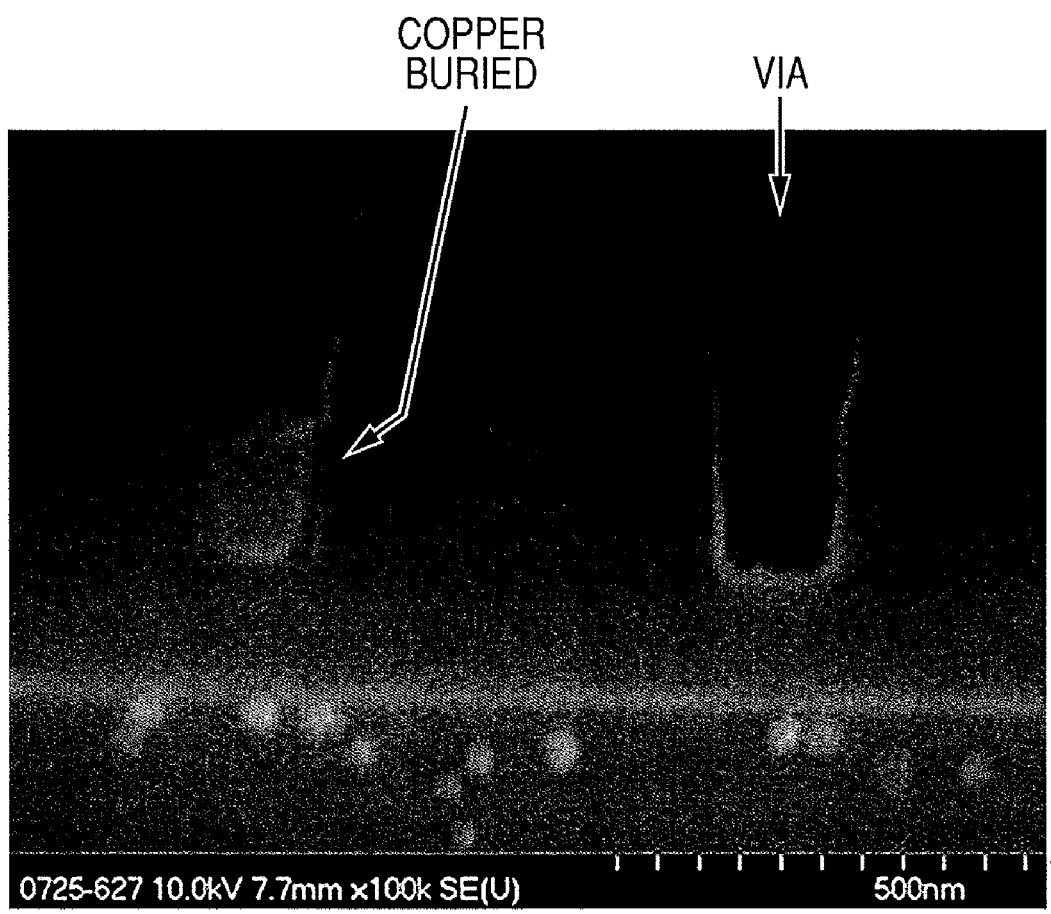
FIG. 5 shows an electron microscope photograph indicating a cross-section observation of a substrate on which vias are buried with metal, in an example of the present invention.

As shown in FIG. 4 and FIG. 5 of surface observation and cross-section observation by SEM, copper can be buried in the vias formed in the silicon oxide film on the substrate 22a. However, there existed both the vias with buried copper and the vias without buried copper. The percentage of vias with buried copper was about 20%, which percentage was presumably due to the existence of vias which did not form the copper chloride (CuCl) therein functioning as the protective film against the etching reaction in the early stages of film-formation under the film-forming condition of Example 1.

In addition, according to the measurement by using SEM, very little copper was formed as the film on the silicon oxide film on the substrate 22a, and the copper was buried only in the vias. Furthermore, according to the measurement by using XRF, only a quantity of below the detection limit (several percentages or less) of chlorine remained on the surface of the substrate 22a. Moreover, the formed copper contained 1% or smaller amount of argon. The amount of rare gas contained in the metal can be determined by using XRF, thermogravimetry-mass (TG-Mass) spectrometer, and the like.

Under the film-forming condition of Example 1, it is considered that both of the copper deposition reaction and the copper etching reaction virtually maintain balance in their competing reactions. FIG. 6 shows a surveyed result of the relation between the copper film-forming rate on a smooth surface of substrate having a silicon oxide film thereon and the chlorine concentration (chlorine concentration at the time of supplying the gas). It is considered that when the chlorine concentration was decreased from the level of Example 1, the copper film-forming rate increased, and thus in the competing reactions between the copper deposition reaction and the copper etching reaction, the copper deposition reaction became predominant. Furthermore, it is considered that when the chlorine concentration was increased from the level of Example 1, the copper was not formed both inside and outside the vias, and in the competing reactions between the copper deposition reaction and the copper etching reaction, the copper etching reaction became predominant.

Example 2

Instead of the above-mentioned conditions, when the supply gas was prepared by diluting chlorine gas ($Cl_2$) by using argon (Ar) to 3.4% by volume, and the total pressure was adjusted to 1.3 Pa, the copper was formed on the surface of the substrate 22a. Except that the substrate temperature was decreased by several degrees Centigrade, other conditions were the same as those in Example 1.

Figure 7:
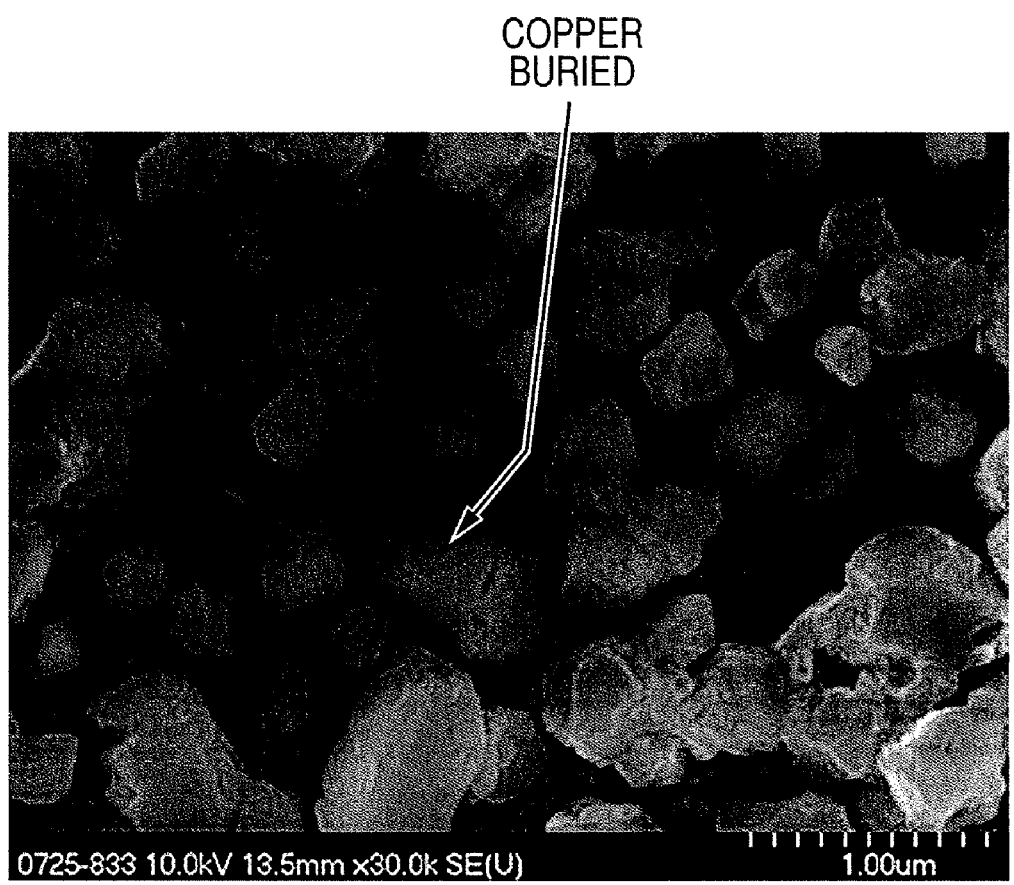
FIG. 7 shows an electron microscope photograph indicating a surface observation of a substrate on which vias are buried with metal, in an example of the present invention.
Figure 8:
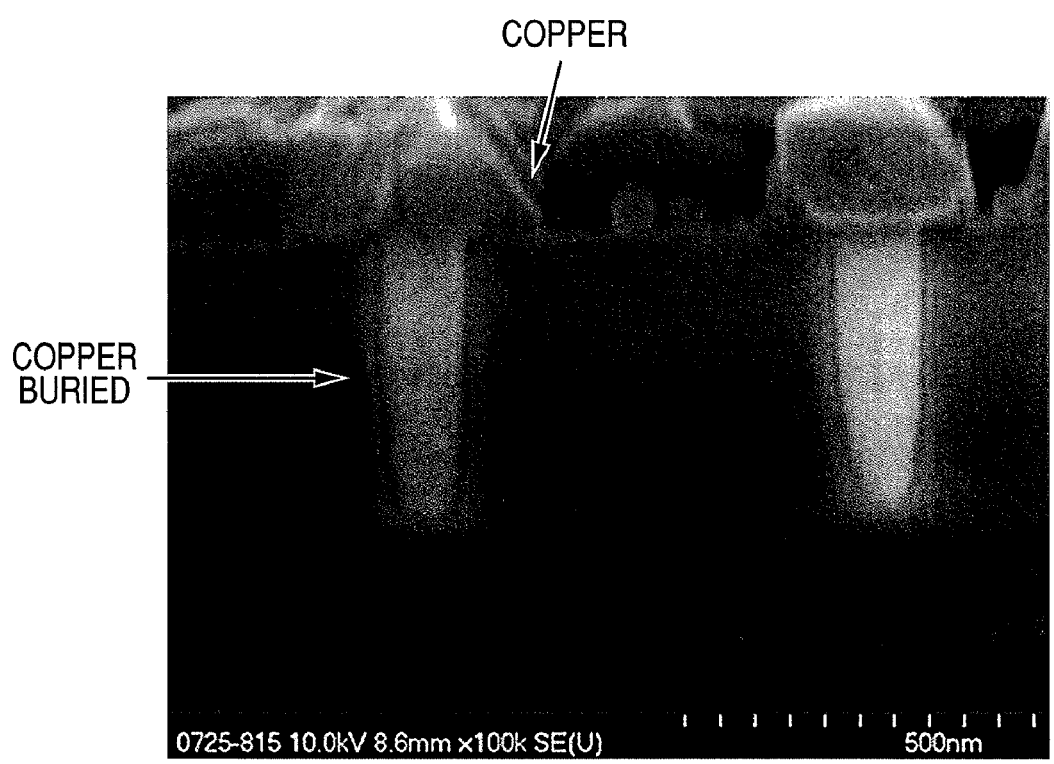
FIG. 8 shows an electron microscope photograph indicating a section observation of a substrate on which vias are buried with metal, in an example of the present invention.

In this case, as shown in SEM surface observation in FIG. 7 and in SEM cross-section observation in FIG. 8, entire vias made it possible to be buried with copper. Meanwhile, the vias were arranged in a regular grid pattern inclined in 45 degrees. As shown in SEM surface observation in FIG. 7, the copper was buried inside the vias and was overflowed outside the via on the substrate 22a. The measurement of the formed copper by using XRF gave the atomic ratio of chlorine (Cl) relative to copper (Cu) of 0.48, which showed that the chlorine-containing copper was formed.

As described above, the film-forming apparatus and the film-forming method in the embodiment of the present invention allow the metal to be buried only in a fine trench and via.

Comparative Example

For example, in the apparatus of wiring-forming 100 illustrated in FIG. 1, when the gas supply nozzle 12 does not supply the $Cl_2$ gas and supplies only the Cu vapor thereto without supplying the $Cl_2$ gas onto the substrate 22a, the Cu layer can be formed on the substrate 22a at a high speed. The formed Cu layer, however, is limited to the surface of the substrate 22a and to the upper part of the concave portion, which plugs the entrance of the concave. As a result, the formation of the Cu layer in the concave portion becomes difficult. Consequently, in the present invention, it is important to supply $Cl_2$ gas, and to maintain balance between the supply of Cu vapor and the supply of $Cl_2$ gas.

Although the above-mentioned embodiments and examples adopted sputtering as the metal supply source, they are not limited. The ablation of metal target by using electron beam irradiation and laser irradiation, and metal heating and sublimation in a crucible, for example, can also be applied. Nevertheless, the utilization of commonly used sputtering apparatus allows the provision of the technology for burying a metal in a fine via and trench, readily and inexpensively.

Alternatively, the metal vapor and the halogen gas may be generated by decomposing the metal halide vapor which is supplied to the chamber 10 through, for example, the gas supply nozzle 12 and the like. For example, the copper chloride vapor may be supplied to the chamber 10 through the gas supply nozzle 12, and simultaneously the copper chloride vapor may be decomposed in the chamber 10 by electric discharge or the like, which thus generates the copper atoms that become the raw material vapor and the chlorine atoms and molecules that become the etchant gas. There are several methods of supplying the copper chloride vapor, including the method of heating the copper chloride to about 400° C. to vaporize or sublimate thereof, and the method of conducting reaction between the metal copper heated to 400° C. or more and the gas containing chlorine, thus generating the copper chloride vapor gas.

The invention claimed is:

1. A method of burying metal, comprising the steps of:
preparing a substrate having a concave portion formed thereon; and
supplying a metal vapor including a metal, in a gaseous state, a halogen-containing gas containing at least a halogen for etching the metal and a metal halide vapor including a metal halide in a gaseous state being a compound of element of the metal and element of the halogen, to the substrate, wherein the metal halide is deposited in the concave portion by supplying the metal halide vapor to the substrate to form a metal halide layer therein, and a metal in the metal vapor is precipitated under the metal halide layer by supplying the metal vapor to the formed metal halide layer, thereby depositing the metal between the metal halide layer and the substrate.

2. A method of burying metal according to claim 1, wherein the step of depositing the metal comprises the step of controlling temperature of the substrate so that the saturated vapor pressure of the metal halide vapor in the concave portion becomes lower than the partial pressure of the metal halide vapor.

3. A method of burying metal according to claim 1, wherein the concave portion is a trench or a via formed on the surface of the substrate, and the metal is selectively deposited in the trench or the via.

4. A method of burying metal according to claim 3, wherein the width of the trench or the diameter of the via is 0.2 μm or less.

5. A method of burying metal according to claim 1, wherein the metal is copper, and the halogen is chlorine.

6. A method of burying metal according to claim 1, wherein a chamber containing the substrate has a target, therein, having the surface made of the metal,
and the method further comprising the steps of:
supplying the halogen-containing gas and a sputtering gas for sputtering of the target to the chamber; at least before the step of depositing the metal and
generating the metal vapor by sputtering the target through the use of the sputtering gas.

7. A method of burying metal according to claim 6, wherein the metal vapor is generated by applying electric power at a power density of 1 $kW/m^2$ to 1 $MW/m^2$ to the target, and by sputtering the target through the use of the sputtering gas.

8. A method of burying metal according to claim 6, wherein the metal deposited on the surface of the substrate contains the sputtering gas.

9. A method of burying metal according to claim 6, wherein the metal halide vapor is generated by a reaction between the metal vapor and the halogen-containing gas.

10. A method of burying metal according to claim 1 further comprising the step, at least before the step of depositing the metal, of supplying a metal halide vapor to a chamber containing the substrate, wherein the metal vapor and the halogen-containing gas are generated by decomposing the supplied metal halide vapor.

11. A method of burying metal according to claim 10, wherein the supplied metal halide vapor is decomposed by electric discharge to generate the metal vapor and the halogen-containing gas.

12. A method of burying metal according to claim 1, wherein the substrate is maintained within the temperature of 100° C. to 400° C.

13. A method of burying metal according to claim 1, wherein, at the time of forming the metal vapor and depositing the metal into the concave portion, the pressure of the gas ambient is set within the range of 0.1 Pa to 100 Pa.

\* \* \* \* \*